United States Patent
Sang

(10) Patent No.: US 10,876,692 B2
(45) Date of Patent: Dec. 29, 2020

(54) LIGHT SOURCE, DISPLAY APPARATUS, ILLUMINATION APPARATUS AND METHOD FOR MANUFACTURING LIGHT SOURCE

(71) Applicants: BEIJING BOE OPTOELECTRONICS TECHNOLOGY CO., LTD., Beijing (CN); BOE TECHNOLOGY GROUP CO., LTD., Beijing (CN)

(72) Inventor: Jian Sang, Beijing (CN)

(73) Assignees: BEIJING BOE OPTOELECTRONICS TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/519,297

(22) Filed: Jul. 23, 2019

(65) Prior Publication Data

US 2020/0166183 A1    May 28, 2020

(30) Foreign Application Priority Data

Nov. 22, 2018    (CN) .......................... 2018 1 1397334

(51) Int. Cl.
| | |
|---|---|
| *F21K 9/90* | (2016.01) |
| *H01L 33/26* | (2010.01) |
| *H01L 33/44* | (2010.01) |
| *F21Y 115/10* | (2016.01) |
| *H01L 33/52* | (2010.01) |

(52) U.S. Cl.
CPC ................ *F21K 9/90* (2013.01); *H01L 33/26* (2013.01); *H01L 33/44* (2013.01); *F21Y 2115/10* (2016.08); *H01L 33/52* (2013.01)

(58) Field of Classification Search
CPC .......... H01L 33/52; H01L 33/50; H01L 33/44
See application file for complete search history.

(56) References Cited

U.S. PATENT DOCUMENTS

| | | | | |
|---|---|---|---|---|
| 2012/0153311 | A1* | 6/2012 | Yuan ......................... | F21K 9/90 257/88 |
| 2015/0219936 | A1* | 8/2015 | Kim ................... | G02F 1/133602 362/97.1 |
| 2017/0294562 | A1* | 10/2017 | Tsuji ..................... | H01L 33/504 |
| 2018/0182940 | A1* | 6/2018 | Yamamoto ............ | H01L 33/504 |
| 2019/0129249 | A1* | 5/2019 | Lee ................... | G02F 1/133606 |

* cited by examiner

*Primary Examiner* — Evan P Dzierzynski
(74) *Attorney, Agent, or Firm* — Kinney & Lange, P.A.

(57) ABSTRACT

A light source, a display apparatus, an illumination apparatus and a method for manufacturing the light source are provided. The light source includes: a first substrate; a second substrate opposite to the first substrate; a plurality of light emitting diode light emitters arranged on a side of the first substrate facing towards the second substrate; and a light homogenization member arranged on a side of the second substrate facing towards the first substrate. The light homogenization member is arranged on a light exit side of the plurality of light emitting diode light emitters and configured such that light emitted from the plurality of light emitting diode light emitters exits homogenously from the second substrate.

17 Claims, 5 Drawing Sheets

LIGHT SOURCE, DISPLAY APPARATUS, ILLUMINATION APPARATUS AND METHOD FOR MANUFACTURING LIGHT SOURCE

CROSS-REFERENCE TO RELATED APPLICATION

This application claims the benefit of Chinese Patent Application No. 201811397334.1 filed on Nov. 22, 2018 with the China National Intellectual Property Administration, the disclosure of which is incorporated herein in entirety by reference.

TECHNICAL FIELD

The present disclosure relates to the technical field of light sources, more particularly, to a light source, a display apparatus including the light source, an illumination apparatus including the light source and a method for manufacturing a light source.

BACKGROUND

A light emitting diode (abbreviated as LED) light source has advantages such as small volume, long lifetime and high efficiency. It has been applied widely in various types of apparatuses such as a display apparatus and an illumination apparatus.

For example, an LED area light source may be used in a backlight module in a liquid crystal display apparatus. However, the typical LED area light source includes a multi-layer structure, for example, it needs to provide the multi-layer structure including a light guide plate, a diffusion plate and a reflecting plate. Thus, the LED area light source includes more members and has a larger thickness.

SUMMARY

Embodiments of the present disclosure provide a light source, comprising: a first substrate; a second substrate opposite to the first substrate; a plurality of light emitting diode light emitters arranged on a side of the first substrate facing towards the second substrate; and a light homogenization member arranged on a side of the second substrate facing towards the first substrate, wherein the light homogenization member is arranged on a light exit side of the plurality of light emitting diode light emitters and configured such that light emitted from the plurality of light emitting diode light emitters exits homogenously from the second substrate.

In some embodiments, the light source further comprises an optical conversion layer arranged between the first substrate and the light homogenization member, the optical conversion layer comprising optical adhesive and fluorescent particles dispersed in the optical adhesive.

In some embodiments, the optical conversion layer further comprises light diffusion particles dispersed in the optical adhesive.

In some embodiments, the light homogenization member comprises a partially transmissive and partially reflective layer configured to transmit a part of light incident onto the partially transmissive and partially reflective layer and reflect another part of the light incident onto the partially transmissive and partially reflective layer.

In some embodiments, the partially transmissive and partially reflective layer comprises a plurality of partially transmissive and partially reflective portions arranged in array and spaced from each other, the plurality of partially transmissive and partially reflective portions being in one-to-one correspondence with the plurality of light emitting diode light emitters, and an orthographic projection of each of the plurality of partially transmissive and partially reflective portions onto the first substrate covers an orthographic projection of a corresponding one of the plurality of light emitting diode light emitters onto the first substrate.

In some embodiments, the light source further comprises a reflective layer arranged between the first substrate and the light homogenization member and configured to reflect light incident onto the reflective layer towards the light exit side of the plurality of light emitting diode light emitters.

In some embodiments, the light source further comprises a wiring layer arranged between the plurality of light emitting diode light emitters and the first substrate, wherein the wiring layer comprises a plurality of contact pads for electrically contacting with the plurality of light emitting diode light emitters.

In some embodiments, each of the plurality of light emitting diode light emitters comprises a first electrode and a second electrode; and the plurality of contact pads comprise a first contact pad electrically connected to the first electrode and a second contact pad electrically connected to the second electrode.

In some embodiments, the light source further comprises: a first wiring layer arranged between the plurality of light emitting diode light emitters and the first substrate; a second wiring layer arranged on a side of the first wiring layer away from the first substrate; and a first insulating layer arranged between the first wiring layer and the second wiring layer, wherein the second wiring layer comprises a plurality of contact pads for electrically contacting with the plurality of light emitting diode light emitters respectively; wherein an electrical connecting portion is formed in the first insulating layer; and the first wiring layer is electrically connected to the contact pads by the electrical connecting portion.

In some embodiments, the light source further comprises seal agent arranged between the first substrate and the second substrate and surrounding the plurality of light emitting diode light emitters, the optical conversion layer and the light homogenization member.

In some embodiments, the light source further comprises: a second insulating layer arranged between the wiring layer and the reflective layer; and/or a protection layer arranged on a side of the reflective layer away from the first substrate.

In some embodiments, the light source further comprises: a second insulating layer arranged between the second wiring layer and the reflective layer; and/or a protection layer arranged on a side of the reflective layer away from the first substrate.

In some embodiments, the plurality of light emitting diode light emitters are light emitting diode chips.

In some embodiments, the first substrate and the second substrate are both glass substrates.

In some embodiments, an area of a surface of the second substrate facing towards the first substrate is less than an area of a surface of the first substrate facing towards the second substrate.

Embodiments of the present disclosure also provide a display apparatus comprising a backlight module, wherein the backlight module comprises the above light source.

In some embodiments, the light source further comprises an optical conversion layer arranged between the first substrate and the light homogenization member, the optical conversion layer comprising optical adhesive and fluorescent particles dispersed in the optical adhesive.

Embodiments of the present disclosure also provide an illumination apparatus comprising one or more light sources as described in the above embodiments.

Embodiments of the present disclosure also provide a method for manufacturing a light source, the method comprising: providing a first substrate and a second substrate; forming a plurality of light emitting diode light emitters on a side of the first substrate; forming a light homogenization member on a side of the second substrate; and assembling the first substrate and the second substrate while keeping the side of the first substrate formed with the plurality of light emitting diode light emitters and the side of the second substrate formed with the light homogenization member to face towards each other.

In some embodiments, after forming the plurality of light emitting diode light emitters on the side of the first substrate, the method further comprises: dispersing light diffusion particles and fluorescent particles into optical adhesive and mixing the light diffusion particles and fluorescent particles in the optical adhesive homogeneously; and coating the first substrate formed with the plurality of light emitting diode light emitters with the optical adhesive having the light diffusion particles and fluorescent particles dispersed therein to form an optical conversion layer.

BRIEF DESCRIPTION OF THE DRAWINGS

From the following description with reference to figures, other objects and advantages of the present disclosure will be apparent and the present disclosure will be understood more comprehensively.

Figure 1:
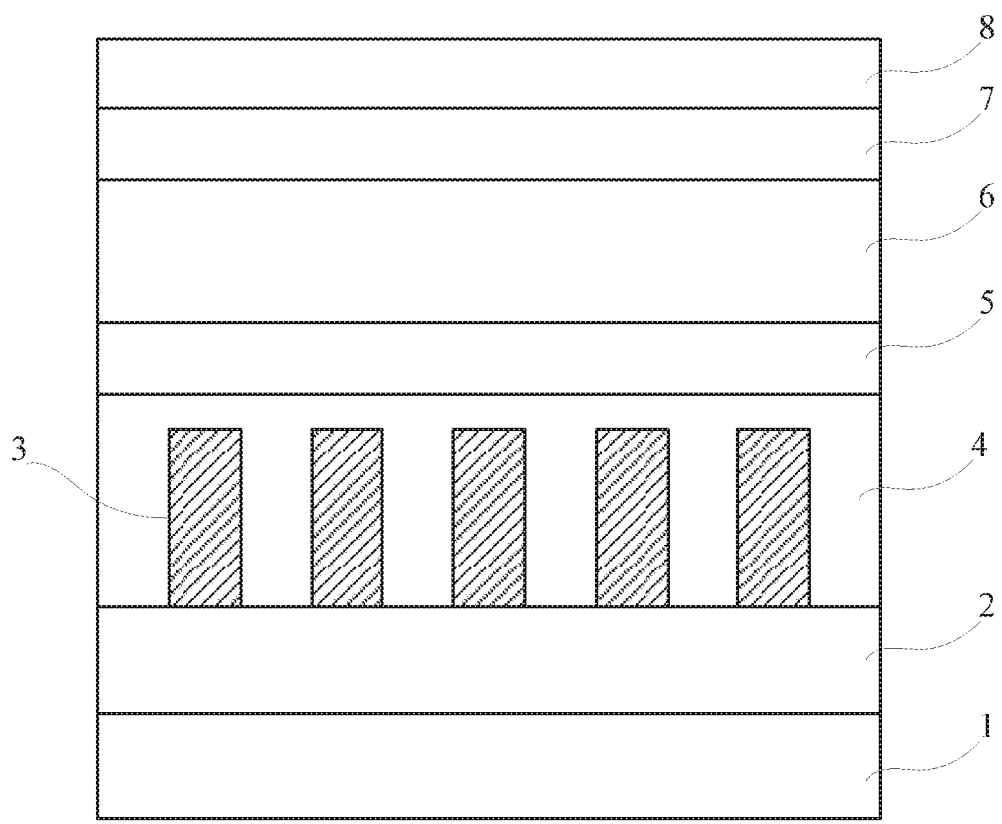
FIG. 1 is a schematic view showing a structure of an LED light source in the related art.

It should be noted that, for the sake of clarity, in drawings for describing embodiments of the present disclosure, sizes of layers, structures or regions may be magnified or demagnified. That is, these drawings are not drawn by real scales.

DETAILED DESCRIPTION OF EMBODIMENTS

Technical solutions of the present disclosure will further be described in detail with reference to the drawings by means of embodiments. Same or similar reference numerals indicate same or similar components throughout the description. The following description of embodiments of the present disclosure with reference to drawings is intended to explain the concept of the present disclosure, rather than being understood as a limitation to the present disclosure.

In addition, in the following detailed description, for the sake of convenience, many specific details will be explained to provide comprehensive understanding of embodiments of the present disclosure. However, it is apparent that one or more embodiments may also be implemented without these specific details.

It should be noted that the terms of "on", "formed on" and "arranged on" in the text may not only represent that one layer is formed or arranged directly on another layer, but also represent that one layer is formed or arranged indirectly on another layer, that is, there are other layers between the two layers.

It should be noted that terms of "first", "second" or etc. may herein be used to describe all kinds of components, members, elements, regions, layers and/or portions, however, these components, members, elements, regions, layers and/or portions should not be limited by these terms. Instead, these terms are used to distinguish one of these components, members, elements, regions, layers and/or portions from another of them. Therefore, for example, in the following discussion, the first component, the first member, the first element, the first region, the first layer and/or the first portion may be called as the second component, the second member, the second element, the second region, the second layer and/or the second portion, without departing from teachings of the present disclosure.

FIG. 1 is a schematic view showing a structure of an LED light source in the related art. As illustrated in FIG. 1, the LED light source includes: a substrate 1, a circuit board 2, a plurality of LED chips 3, optical adhesive 4, a diffusion plate 5, an optical conversion layer 6, a prism film 7 and an adhesive tape 8. The circuit board 2 is arranged on the substrate 1, for example, the circuit board 2 may be a printed circuit board (PCB) or a flexible plate of circuit (FPC). The plurality of LED chips 3 may be surface-mounted on the circuit board 2. The optical adhesive 4 encapsulates the plurality of LED chips 3 on the circuit board 2. The diffusion plate 5 is arranged on a light exit side of the LED chips 3. In FIG. 1, the diffusion plate 5 is arranged on a side of the LED chips 3 away from the substrate 1 to diffuse light emitted from the LED chips 3. For example, the optical conversion layer 6 may include a fluorescent film layer or a quantum dot layer arranged on the light exit side of the LED chips 3 for converting colors of the light emitted from the LED chips 3. The adhesive tape 8 is arranged on a side of the prism film 7 away from the substrate 1, for adhering an LED light emitter to other components. For example, the adhesive tape 8 may be in a shape of a rectangular ring, for adhering the LED light emitters onto a display panel to form a backlight source of the display apparatus. In this structure, single LED chip 3 may be regarded as a point light source. The LED light emitters include a plurality of LED chips arranged in array, to form an LED area light source. However, the LED area light source includes a great number of components and has complicated manufacturing process.

And, in the above LED area light source, the substrate 1 has a thickness equal to or greater than 150 μm; the circuit board 2 has a thickness equal to or greater than 150 μm; a layer formed by the LED chips 3 and the optical adhesive 4 has a thickness equal to or greater than 300 μm; the diffusion plate 5 has a thickness equal to or greater than 100 μm; the optical conversion layer 6 has a thickness equal to or greater than 200 μm, the prism film 7 has a thickness equal to or greater than 100 μm, and the adhesive tape 8 has a thickness equal to or greater than 100 μm. In this way, the LED area light source has a total thickness equal to or greater than 1100 μm, thus, in the related art, it is very difficult to achieve lightening and thinning of the LED area light source.

Figure 2:
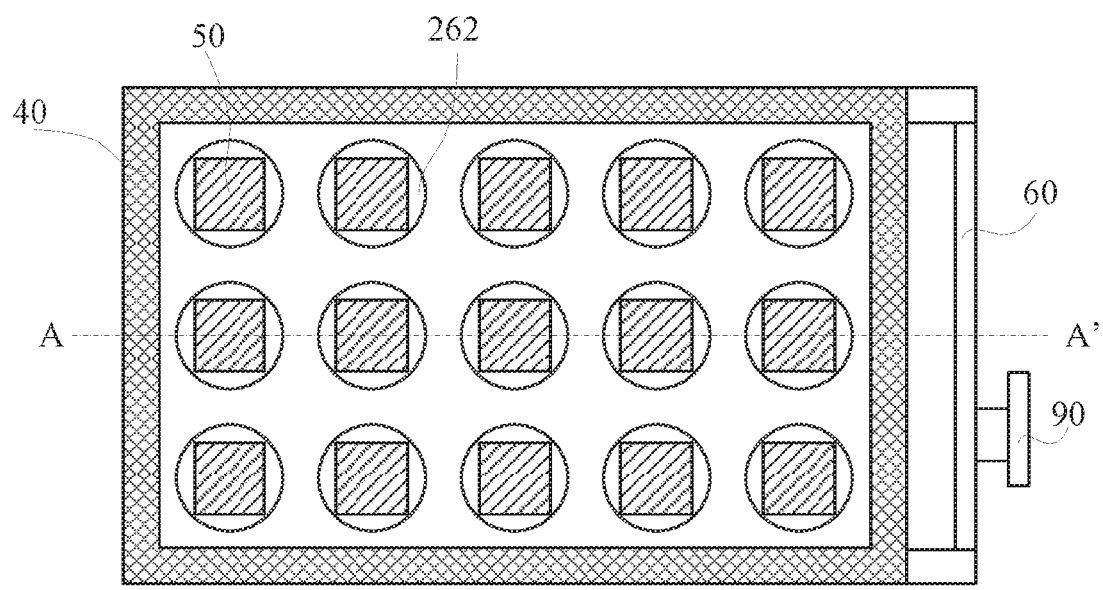
FIG. 2 is a schematic top view showing a light source in accordance with some embodiments of the present disclosure.
Figure 3:
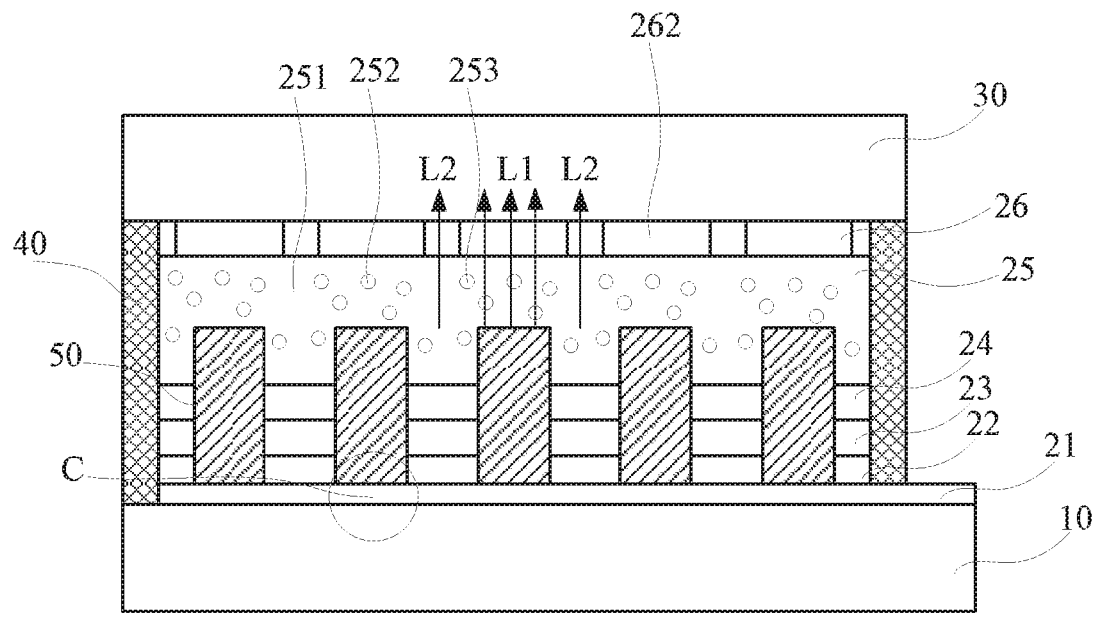
FIG. 3 is a schematic cross sectional view taken along a line A-A' in FIG. 2 showing the light source in accordance with some embodiments of the present disclosure.

FIG. 2 is a schematic top view showing a light source according to some embodiments of the present disclosure. FIG. 3 is a cross sectional view, taken along the line A-A' in FIG. 2, of the light source according to the embodiments of the present disclosure. Referring to FIG. 2 and FIG. 3, the light source according to the embodiments of the present disclosure may include a first substrate 10, a second substrate 30 and a functional layer arranged between the first substrate 10 and the second substrate 30. For example, both of the first substrate 10 and the second substrate 30 may be glass substrates. They are arranged to face towards each other. In the shown embodiments, an orthographic projection of the second substrate 30 on the first substrate 10 falls within the first substrate 10 and has an area less than an area of an upper surface of the first substrate 10. For example, an electrical connection region such as a bonding region may be arranged on the part of the first substrate 10 beyond the second substrate 30.

As shown, the light source according to the embodiments of the present disclosure may further include a seal agent 40 arranged between the first substrate 10 and the second substrate 30. The seal agent 40 may form a space between the first substrate 10 and the second substrate 30, for accommodating the functional layer. The seal agent 40 may be arranged in a ring between the first substrate 10 and the second substrate 30. The seal agent 40 may surround at least one part of the functional layer to seal the at least one part of the functional layer to block water and oxygen gas, so as to prevent the functional layer from being eroded by the external water and oxygen gas.

Next, the functional layer between the first substrate 10 and the second substrate 30 will be described further in details with reference to FIG. 2 and FIG. 3.

As shown in FIG. 3, the light source according to the embodiments of the present disclosure may further include a wiring layer 21, LED light emitters 50, a second insulating layer 22, a reflective layer 23, a protection layer 24 and an optical conversion layer 25, arranged on the first substrate 10 and a homogenization member 26 arranged on the second substrate 30. In some embodiments, the homogenization member 26 may include an optical film layer for homogenizing light, for example, it may include such as prisms.

As shown in FIG. 2, the light source may include a plurality of LED light emitters 50 arranged on the first substrate 10. The plurality of LED light emitters 50 are arranged in an array on the first substrate 10. In this structure, each of the plurality of LED light emitters 50 may be regarded as a point light source. The light source according to the embodiments of the present disclosure includes a plurality of LED light emitters arranged in an array to form an LED area light source.

For example, each of the plurality of LED light emitters 50 may be an LED chip, such as an LED flip chip. The flip chip has a structure without pins. In the flip chip, by means of bumps on the chip, the chip is directly connected to a circuit by solder or electrically conductive adhesive points with a surface of the chip kept to face down. For example, each of the LED chips may have a size of 5*9 mil, 6*20 mil (i.e., milli-inch, 1 mil is equal to one thousandth of an inch) and a thickness of 100 μm to 300 μm. For example, each of the LED chips may have a thickness of about 150 μm.

Figure 4:
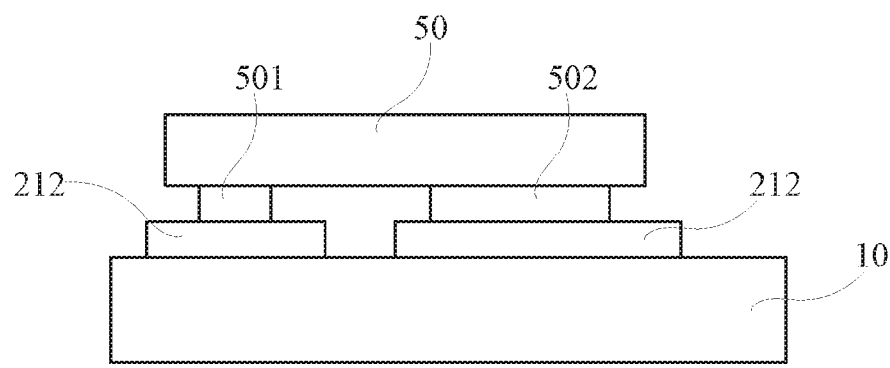
FIG. 4 is a schematic magnification view of the portion C shown in FIG. 3.

The wiring layer 21 may be arranged on the first substrate 10 and arranged between the first substrate 10 and the LED light emitters 50. In some embodiments, the wiring layer 21 may include a plurality of contact pads 212. Referring to FIG. 4, which is a magnified view of portion C in FIG. 3, it schematically shows a contact structure of the LED chips (for example flip chips) and the wiring layer 21. For example, the plurality of contact pads 212 may be in one-to-one correspondence with electrodes of the plurality of LED light emitters 50 (that is LED chips) respectively. Each of the LED chips may include a first electrode 501 (such as a positive electrode) and a second electrode 502 (such as a negative electrode). The first electrode 501 is electrically connected to a contact pad 212 while the second electrode 502 is electrically connected to another contact pad 212. The plurality of contact pads 212 electrically connected to the first electrode 501 may also be electrically connected to each other by some traces in the wiring layer 21. The plurality of contact pads 212 electrically connected to the second electrode 502 may also be electrically connected to each other by other traces in the wiring layer 21 and electrically connected to an electrical connection region 60 (bonding region, for example, the electrical connection region 60 may be a region in the wiring layer 21). The electrical connection region 60 may be electrically connected to an external circuit 90. That is, each of the LED chips may be electrically connected to the external circuit 90 by the contact pads, traces and electrical connection region, to be driven by the external circuit 90. For example, the contact pads 212 and the traces may be made from materials containing copper (Cu) or other electrically conductive metal. As shown, the electrical connection region 60 may be arranged on the first substrate 10 and an orthographic projection of the electrical connection region 60 onto the first substrate 10 is not overlapped with an orthographic projection of the second substrate 30 onto the first substrate 10, for the convenience of electrical connection to the external circuit. For example, the thickness of the wiring layer 21 may be in a range from thousands of angstroms to several micrometers.

The reflective layer 23 may be arranged on the first substrate 10, and arranged on a side of the wiring layer 21 away from the first substrate 10. The reflective layer 23 may include a single material layer formed by a metal such as silver (Ag) or aluminum (Al), or the reflective layer 23 may include a plurality of optical reflective film layers, for example, the plurality of optical reflective film layers include high refractivity material film layers and low refractivity material film layers arranged alternately. For example, the reflective layer 23 may have thickness in nanoscale and reflectivity not less than 90%.

The second insulating layer 22 may be arranged on the first substrate 10 and arranged between the wiring layer 21 and the reflective layer 23, for electrically insulating the wiring layer 21 from the reflective layer 23.

The protection layer 24 may be arranged on the first substrate 10 and arranged on a side of the reflective layer 23 away from the first substrate 10, for protecting the reflective layer 23, for example to prevent the reflective layer 23 from being oxidized.

As shown in FIG. 3, the second insulating layer 22, the reflective layer 23 and the protection layer 24 are arranged between adjacent ones of the plurality of LED light emitters 50, that is, an orthographic projection of each of the second insulating layer 22, the reflective layer 23 and the protection layer 24 on the first substrate 10 is not overlapped with orthographic projections of the plurality of LED light emitters 50 onto the first substrate 10.

For example, the optical conversion layer 25 may include optical adhesive 251 and fluorescent particles 253 such as fluorescent powders and/or quantum dots. The fluorescent powders may include a combination of red fluorescent powders, green fluorescent powders and blue fluorescent powders, or a combination of red fluorescent powders and green fluorescent powders or yellow fluorescent powders. For example, the material of the fluorescent powders may include aluminate series of fluorescent powders, silicate series of fluorescent powders, fluoride series of fluorescent powders or nitric oxide series of fluorescent powders. For example, the quantum dots may include red light quantum dots that emit red light after being excited by blue light and/or green light quantum dots that emit green light after being excited by blue light. The fluorescent powders and/or quantum dots may be dispersed (doped)(for example, distributed homogenously) in the optical adhesive 251 to form the optical conversion layer 25.

For example, the optical conversion layer 25 may include the optical adhesive 251 and light diffusion particles 252. The optical adhesive 251 may be LED pouring sealant having high refractivity and high transparency for protecting the LED light emitters and increasing luminous flux of the LED light emitters, for example, the optical adhesive 251 may contain such as epoxy resin or silica gel. The light diffusion particles 252 may be configured to diffuse light emitted from the respective LED light emitters 50, for example, the light diffusion particles 252 may be particles formed by high refractivity and transparent optical materials such as polycarbonate (PC) or polymethyl methacrylate (PMMA). They have diameter in micron order. The light diffusion particles 252 may be dispersed (doped) (for example, distributed homogenously) in the optical adhesive 251 to form the optical conversion layer 25.

For example, the optical conversion layer 25 may include the optical adhesive 251, light diffusion particles 252 and fluorescent particles 253 such as fluorescent powders and/or quantum dots. The fluorescent powders may include a combination of red fluorescent powders, green fluorescent powders and blue fluorescent powders, or a combination of red fluorescent powders and green fluorescent powders or yellow fluorescent powders. For example, the material of the fluorescent powders may include aluminate series of fluorescent powders, silicate series of fluorescent powders, fluoride series of fluorescent powders or nitric oxide series of fluorescent powders. For example, the quantum dots may include red light quantum dots that emit red light after being excited by blue light and/or green light quantum dots that emit green light after being excited by blue light. The light diffusion particles 252 and the fluorescent powders and/or quantum dots may be dispersed (doped)(for example, distributed homogenously) in the optical adhesive 251 to form the optical conversion layer 25.

The light homogenization member 26 may include a partially transmissive and partially reflective layer arranged on the second substrate 30. As shown in FIG. 3, the partially transmissive and partially reflective layer is arranged on a side of the second substrate 30 facing towards the first substrate 10. For example, the partially transmissive and partially reflective layer is a patterned partially transmissive and partially reflective layer, that is, the partially transmissive and partially reflective layer includes a plurality of partially transmissive and partially reflective portions 262 arranged spaced from each other. In position, the plurality of partially transmissive and partially reflective portions 262 are in one-to-one correspondence with the plurality of LED light emitters 50, that is, an orthographic projection of each of the plurality of partially transmissive and partially reflective portions 262 onto the first substrate 10 covers an orthographic projection of the corresponding one of the plurality of light emitting diode light emitters 50 onto the first substrate 10. For example, as shown in FIG. 2, the orthographic projection of each of the plurality of partially transmissive and partially reflective portions 262 onto the first substrate 10 may have a circular shape and the orthographic projection of each of the plurality of light emitting diode light emitters 50 onto the first substrate 10 may have a square shape. The circular shape covers the square shape. The partially transmissive and partially reflective layer may include a single metal material layer, or may include a plurality of optical film layers, for example, the plurality of optical film layers include high refractivity material film layers and low refractivity material film layers arranged alternately.

In particular, design of parameters such as area and reflectivity of each of the plurality of partially transmissive and partially reflective portions 262 is needed. The factors considered in design may include shape of light emitted from the corresponding LED chips, sizes of the LED chips, pitch of LED chips, distance between the LED chips and the partially transmissive and partially reflective layer, etc.

If the light homogenization member such as the partially transmissive and partially reflective layer is not provided, the light emitted from the LED light emitters 50 will be emitted directly from the part of the second substrate 30 facing towards the LED light emitters as indicated by light L1 in FIG. 3, that is, each of the LED light emitters will emit great quantity of light towards its front so as to cause non-uniformity of light emitted out from the second substrate. In the embodiments, by means of the light homogenization member having the partially transmissive and partially reflective layer, the quantity of the light L1 emitted towards the front of the LED light emitters may be reduced, to increase the quantity of light emitted out from the part of the second substrate facing towards gaps between adjacent ones of the LED light emitters, that is, to increase the quantity of light L2 emitted out from the position between adjacent ones of the LED light emitters, such that the light emitted out from the second substrate can become more homogenous. For example, when the light source is used as a backlight source of the display module, the brightness of displayed pictures may be more homogenous.

For example, the LED light emitters 50 may include blue LEDs emitting blue light; the optical conversion layer 25 may include the optical adhesive, light diffusion particles distributed homogeneously in the optical adhesive, red light quantum dots that emit red light after being excited by blue light and green light quantum dots that emit green light after being excited by blue light. In the exemplified embodiments, the LED light emitters 50 emit the blue light in response to a current driving signal. A part of the blue light excites the red light quantum dots and the green light quantum dots in the optical conversion layer 25 such that the red light quantum dots and the green light quantum dots emit the red light and the green light respectively. In this way, the blue light, the red light and the green light are mixed into a white light. After being diffused by the light diffusion particles, a part of the white light is transmitted through the light homogenization member 26 and then emitted out from the second substrate 30; the other part of the white light is reflected by the partially transmissive and partially reflective portions 262 and then is transmitted again through the light diffusion particles, the light homogenization member 26 and the second substrate 30 to be emitted after reflected by the reflective layer 23. It should be understood that the other part of the white light transmitted again through the light homogenization member 26 will still contain a certain part that will be reflected by the partially transmissive and partially reflective portions 262 to repeat the above process. By providing the light homogenization member, the light is reflected repeatedly and the reflected light passes through the light diffusion particles repeatedly. It is beneficial to increase the homogenization of the light emitted out from the second substrate such that the light is emitted out from the second substrate homogeneously.

The light source according to the embodiments of the present disclosure includes the first substrate, the second substrate and the functional layer between the first substrate and the second substrate and also provides the seal agent for sealing the functional layer to prevent the external water and oxygen gas from eroding the functional layer such that the light source can have a simpler structure. Further, the total thickness of the light source is substantially equal to sum of thickness of the first substrate, thickness of the second substrate and thickness of the seal agent. The thickness of the seal agent mainly depends on thickness of the LED chips, thickness of the respective film layers on the first substrate and the second substrate and gap between the LED chips and the second substrate, for example, the LED chips may have thickness of about 150 μm, and the respective film layers on the first substrate and the second substrate may have relatively small thickness and the thickness of the reflective layer may be in nano-scale, the thickness of the wiring layer may be in a range from thousands of angstroms to several micrometers, that is, the thickness of the seal agent may be about 200 μm. For example, again, the thickness of each of the first substrate and the second substrate may be about 200 μm. Therefore, the total thickness of the light source according to the embodiments of the present disclosure may be about 600 μm. The light source shown in FIG. 1 has a total thickness not less than 1100 μm. Thus, it may achieve lightening and thinning of the area light source.

In some embodiments of the present disclosure, the insulating layer, the reflective layer, the protection layer and part of the optical conversion layer are overlapped with the LED chips in the thickness direction, thus, the insulating layer, the reflective layer, the protection layer and part of the optical conversion layer will not increase the total thickness of the light source. In addition, the thickness of the wiring layer may be small, for example, in a range from thousands of angstroms to several micrometers, and thus it may achieve lightening and thinning of the area light source.

With reference to FIG. 3, the light source according to the embodiments of the present disclosure may be manufactured by the following steps. The wiring layer 21 is formed on the first substrate 10, for example by evaporation or sputtering. The plurality of LED light emitters (for example LED chips) 50 may be welded on the contact pads on the wiring layer 21 by process for batch processing. For example, the material of welding may be an electrically conductive material selected from such as tin, silver, ACF (Anisotropic Conductive Film). The insulating layer 22, the reflective layer 23 and the protection layer 24 are formed sequentially on the wiring layer 21 for example by evaporation or sputtering. The light diffusion particles 252, the fluorescent particles 253 are doped in the optical adhesive 251 and mixed homogeneously. Then, the optical adhesive 251 with the light diffusion particles 252 and the fluorescent particles 253 dispersed (doped) therein are dispensed on the protection layer 24 (i.e., dispensing process) to perform coating, leveling and curing processes in sequence, so as to form the optical conversion layer 25 on the protection layer 24. The light homogenization member 26 is formed on the second substrate 30 for example by evaporation or sputtering. The first substrate 10 and the second substrate 30 are assembled. The seal agent 40 is formed between the first substrate 10 and the second substrate 30.

Figure 5:
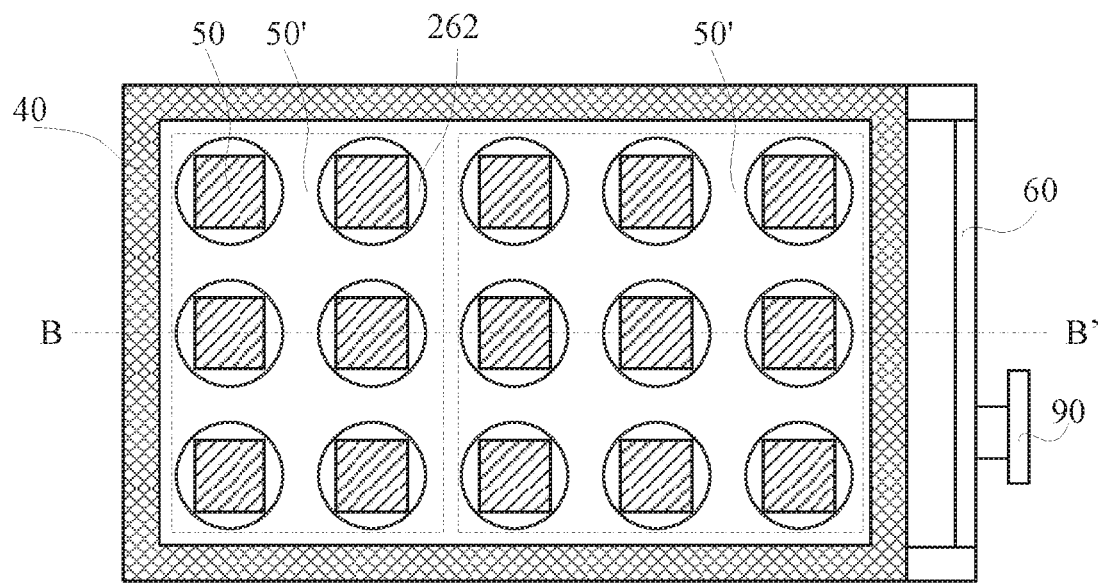
FIG. 5 is a schematic top view showing a light source in accordance with other embodiments of the present disclosure.
Figure 6:
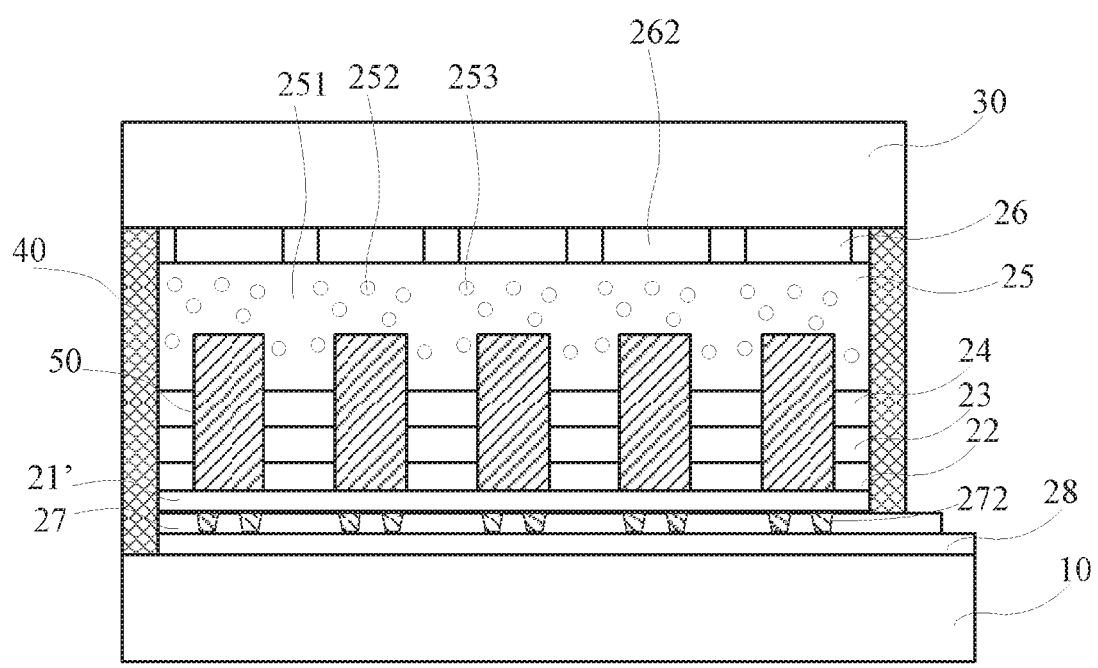
FIG. 6 is a schematic cross sectional view taken along a line B-B' in FIG. 5 showing the light source in accordance with some embodiments of the present disclosure.

FIG. 5 is a schematic plan view of a light source according to other embodiments of the present disclosure. FIG. 6 is a schematic cross sectional view of the light source according to the other embodiments of the present disclosure taken along a line B-B' shown in FIG. 5. It should be noted that the common part of the light source shown in FIG. 5 and FIG. 6 and that shown in FIG. 2 and FIG. 3 may refer to the above description with reference to FIG. 2 and FIG. 3, in which same components are represented by same reference numerals.

With reference to FIG. 5 and FIG. 6, the light source according to the other embodiments of the present disclosure may also include the first substrate 10, the second substrate 30 and the functional layer arranged between the first substrate 10 and the second substrate 30. For example, both of the first substrate 10 and the second substrate 30 may be glass substrates. They are arranged to face towards each other. In the shown embodiments, an orthographic projection of the second substrate 30 on the first substrate 10 falls within the first substrate 10 and has an area less than an area of an upper surface of the first substrate 10. For example, an electrical connection region such as a bonding region may be arranged on the part of the first substrate 10 beyond the second substrate 30.

As shown, the light source according to the embodiments of the present disclosure may further include the seal agent 40 arranged between the first substrate 10 and the second substrate 30. The seal agent 40 may form a space between the first substrate 10 and the second substrate 30, for accommodating the functional layer. The seal agent 40 may be arranged in a ring between the first substrate 10 and the second substrate 30. The seal agent 40 may surround at least one part of the functional layer to seal the at least one part of the functional layer to block water and oxygen gas, so as to prevent the functional layer from being eroded by the external water and oxygen gas.

As shown in FIG. 5, the light source may include a plurality of groups 50' of LED light emitters (indicated by dashed boxes in FIG. 5) on the first substrate 10. Each group of the plurality of groups 50' of LED light emitters may include at least two LED light emitters 50. The plurality of groups 50' of LED light emitters and the plurality of LED light emitters 50 are all arranged in array on the first substrate 10. In this structure, each of the plurality of LED light emitters 50 may be regarded as a point light source. The light source according to the embodiments of the present disclosure includes the plurality of LED light emitters arranged in array to form an LED area light source.

For example, each of the plurality of LED light emitters 50 may be an LED chip, such as an LED flip chip. The flip chip has a structure without pins. In the flip chip, by means of bumps on the chip, the chip is directly connected to a circuit by solder or electrically conductive adhesive points with a surface of the chip kept to face down. For example, each of the LED chips may have a size of 5*9 mil, 6*20 mil (i.e., milli-inch, 1 mil is equal to one thousandth of an inch) and a thickness of 100 μm to 300 μm. For example, each of the LED chips may have a thickness of about 150 μm.

As shown in FIG. 6, the light source may further include a first wiring layer 28, a first insulating layer (also called as wiring insulating layer) 27, a second wiring layer 21', LED light emitters 50, a second insulating layer 22, a reflective layer 23, a protection layer 24 and an optical conversion layer 25, arranged on the first substrate 10. The light source may further include the homogenization member 26 arranged on a side of the second substrate 30 facing towards the first substrate 10.

The first wiring layer 28 may be arranged on the first substrate 10 and the second wiring layer 21' is arranged on a side of the first wiring layer 28 away from the first substrate 10. The first insulating layer 27 is arranged between the first wiring layer 28 and the second wiring layer 21', to electrically insulate the first wiring layer 28 from the second wiring layer 21'.

For example, the second wiring layer 21' may include a plurality of contact pads 212. For example, the plurality of contact pads 212 may be in one-to-one correspondence with the plurality of LED light emitters 50 respectively. Each of the plurality of LED light emitters 50 is electrically connected to the corresponding contact pad 212 and a structure of the second wiring layer 21' and its connection structure to the LED light emitters may refer to FIG. 4 and the above description with reference to FIG. 4.

As shown in FIG. 6, a via hole may be provided in the first insulating layer 27, and an electrical connection portion 272 is formed in the via hole. For the respective LED light emitters 50 in each group of the plurality of groups 50' of LED light emitters, their corresponding contact pads 212 are electrically connected to each other and are electrically connected to the first wiring layer 28 by the electrical connection portion 272. The first wiring layer 28 is electrically connected to an electrical connection region 60 (bonding region, for example, the electrical connection region 60 may be a region in the first wiring layer 28). The plurality of contact pads 212 may be electrically connected to an external circuit 90 by the electrical connection region 60.

In the embodiments, the second wiring layer 21' in an upper portion is configured to electrically connect all of LED light emitters 50 within the respective groups 50' of LED light emitters respectively, i.e., used as internal wiring of the groups of LED light emitters; the first wiring layer 28 in a lower portion is configured to electrically connect all of groups 50' of LED light emitters to the external circuit, i.e., used as external wiring of the groups of LED light emitters. Such design of layers is beneficial to wiring arrangement. For example, the thickness of each of the first wiring layer 28, the first insulating layer 27 and the second wiring layer 21' may be in a range from thousands of angstroms to several micrometers.

The reflective layer 23 may be arranged on the first substrate 10, and arranged on a side of the second wiring layer 21' away from the first substrate 10. The reflective layer 23 may include a single material layer formed by a metal such as silver (Ag) or aluminum (Al), or the reflective layer 23 may include a plurality of optical reflective film layers, for example, the plurality of optical reflective film layers include high refractivity material film layers and low refractivity material film layers arranged alternately. For example, the reflective layer 23 may have thickness in nanoscale and reflectivity not less than 90%.

The second insulating layer 22 may be arranged on the first substrate 10 and arranged between the second wiring layer 21' and the reflective layer 23, for electrically insulating the second wiring layer 21' from the reflective layer 23.

The protection layer 24 may be arranged on the first substrate 10 and arranged on a side of the reflective layer 23 away from the first substrate 10, for protecting the reflective layer 23, for example to prevent the reflective layer 23 from being oxidized.

As shown in FIG. 6, the second insulating layer 22, the reflective layer 23 and the protection layer 24 are arranged between adjacent ones of the plurality of LED light emitters 50, that is, an orthographic projection of each of the second insulating layer 22, the reflective layer 23 and the protection layer 24 on the first substrate 10 is not overlapped with orthographic projections of the plurality of LED light emitters 50 onto the first substrate 10.

For example, the optical conversion layer 25 may include optical adhesive 251 and fluorescent particles 253 such as fluorescent powders and/or quantum dots. The fluorescent powders may include a combination of red fluorescent powders, green fluorescent powders and blue fluorescent powders, or a combination of red fluorescent powders and green fluorescent powders or yellow fluorescent powders. For example, the material of the fluorescent powders may include aluminate series of fluorescent powders, silicate series of fluorescent powders, fluoride series of fluorescent powders or nitric oxide series of fluorescent powders. For example, the quantum dots may include red light quantum dots that emit red light after being excited by blue light and/or green light quantum dots that emit green light after being excited by blue light. The fluorescent powders and/or quantum dots may be dispersed (doped)(for example, distributed homogenously) in the optical adhesive 251 to form the optical conversion layer 25.

For example, the optical conversion layer 25 may include the optical adhesive 251 and light diffusion particles 252. The optical adhesive 251 may be LED pouring sealant having high refractivity and high transparency for protecting the LED light emitters and increasing luminous flux of the LED light emitters, for example, the optical adhesive 251 may contain such as epoxy resin or silica gel. The light diffusion particles 252 may be configured to diffuse light emitted from the respective LED light emitters 50, for example, the light diffusion particles 252 may be particles formed by high refractivity and transparent optical materials such as polycarbonate (PC) or polymethyl methacrylate (PMMA). They have diameter in micron order. The light diffusion particles 252 may be dispersed (doped)(for example, distributed homogenously) in the optical adhesive 251 to form the optical conversion layer 25.

For example, the optical conversion layer 25 may include the optical adhesive 251, light diffusion particles 252 and fluorescent particles 253 such as fluorescent powders and/or quantum dots. The fluorescent powders may include a combination of red fluorescent powders, green fluorescent powders and blue fluorescent powders, or a combination of red fluorescent powders and green fluorescent powders or yellow fluorescent powders. For example, the material of the fluorescent powders may include aluminate series of fluorescent powders, silicate series of fluorescent powders, fluoride series of fluorescent powders or nitric oxide series of fluorescent powders. For example, the quantum dots may include red light quantum dots that emit red light after being excited by blue light and/or green light quantum dots that emit green light after being excited by blue light. The light diffusion particles 252 and the fluorescent powders and/or quantum dots may be doped (for example, distributed homogenously) in the optical adhesive 251 to form the optical conversion layer 25.

The light homogenization member 26 may include a partially transmissive and partially reflective layer arranged on the second substrate 30. As shown in FIG. 6, the partially transmissive and partially reflective layer is arranged on a side of the second substrate 30 facing towards the first substrate 10. For example, the partially transmissive and partially reflective layer is a patterned partially transmissive and partially reflective layer, that is, the partially transmissive and partially reflective layer includes a plurality of partially transmissive and partially reflective portions 262 arranged spaced from each other. The plurality of partially transmissive and partially reflective portions 262 correspond in position to the plurality of LED light emitters 50 respectively, that is, an orthographic projection of each of the plurality of partially transmissive and partially reflective portions 262 onto the first substrate 10 covers an orthographic projection of the corresponding one of the plurality of light emitting diode light emitters 50 onto the first substrate 10. For example, as shown in FIG. 5, the orthographic projection of each of the plurality of partially transmissive and partially reflective portions 262 onto the first substrate 10 may have a circular shape and the orthographic projection of each of the plurality of light emitting diode light emitters 50 onto the first substrate 10 may have a square shape. The circular shape covers the square shape. The partially transmissive and partially reflective layer may include a single metal material layer, or may include a plurality of optical film layers, for example, the plurality of optical film layers include high refractivity material film layers and low refractivity material film layers arranged alternately.

In particular, design of parameters such as area and reflectivity of each of the plurality of partially transmissive and partially reflective portions 262 is needed. The factors considered in design may include shape of light emitted from the corresponding LED chips, sizes of the LED chips, pitch of LED chips, distance between the LED chips and the partially transmissive and partially reflective layer, etc.

For example, the LED light emitters 50 may include blue LEDs emitting blue light; the optical conversion layer 25 may include the optical adhesive, light diffusion particles distributed homogeneously in the optical adhesive, red light quantum dots that emit red light after being excited by blue light and green light quantum dots that emit green light after being excited by blue light. In the exemplified embodiments, the LED light emitters 50 emit the blue light in response to a current driving signal. A part of the blue light excites the red light quantum dots and the green light quantum dots in the optical conversion layer 25 such that the red light quantum dots and the green light quantum dots emit the red light and the green light respectively. In this way, the blue light, the red light and the green light are mixed into a white light. After being diffused by the light diffusion particles, a part of the white light is transmitted through the light homogenization member 26 and the second substrate 30 and then emitted out from the second substrate 30; the other part of the white light is reflected by the partially transmissive and partially reflective portions 262 and then is transmitted again through the light diffusion particles, the light homogenization member 26 and the second substrate 30 to be emitted out after reflected by the reflective layer 23. It should be understood that the other part of the white light transmitted again through the light homogenization member 26 will still contain a certain part that will be reflected by the partially transmissive and partially reflective portions 262 to repeat the above process. By providing the light homogenization member, the light is reflected repeatedly and the reflected light passes through the light diffusion particles repeatedly. It is beneficial to increase the homogenization of the light emitted out from the second substrate such that the light is emitted out from the second substrate homogeneously.

The light source according to the embodiments of the present disclosure includes the first substrate, the second substrate and the functional layer between the first substrate and the second substrate and also provides the seal agent for sealing the functional layer to prevent the external water and oxygen gas from eroding the functional layer such that the light source can have a simpler structure. Further, the total thickness of the light source is substantially equal to sum of thickness of the first substrate, thickness of the second substrate and thickness of the seal agent. The thickness of the seal agent mainly depends on thickness of the LED chips, thickness of the respective film layers on the first substrate and the second substrate and gap between the LED chips and the second substrate, for example, the LED chips may have thickness of about 150 μm, and the respective film layers on the first substrate and the second substrate may have relatively small thickness and the thickness of the reflective layer may be in nano-scale, the thickness of the wiring layer may be in a range from thousands of angstroms to several micrometers, that is, the thickness of the seal agent may be about 200 μm. For example, again, the thickness of each of the first substrate and the second substrate may be about 200 μm. Therefore, the total thickness of the light source according to the embodiments of the present disclosure may be about 600 μm. The light source shown in FIG. 1 has a total thickness not less than 1100 μm. Thus, it may achieve lightening and thinning of the area light source.

In some embodiments of the present disclosure, the insulating layer (such as the first insulating layer and the second insulating layer), the reflective layer, the protection layer and part of the optical conversion layer are overlapped with the LED chips in the thickness direction, thus, the insulating layer, the reflective layer, the protection layer and part of the optical conversion layer will not increase the total thickness of the light source. In addition, the thickness of the wiring layer may be small, for example, in a range from thousands of angstroms to several micrometers, and thus it may achieve lightening and thinning of the area light source.

As discussed above, embodiments of the present disclosure provide a new structure of light source, which may achieve an area light source with simple structure and increase homogenization of the light emitted from the area light source and facilitate lightening and thinning of the area light source.

Figure 9:
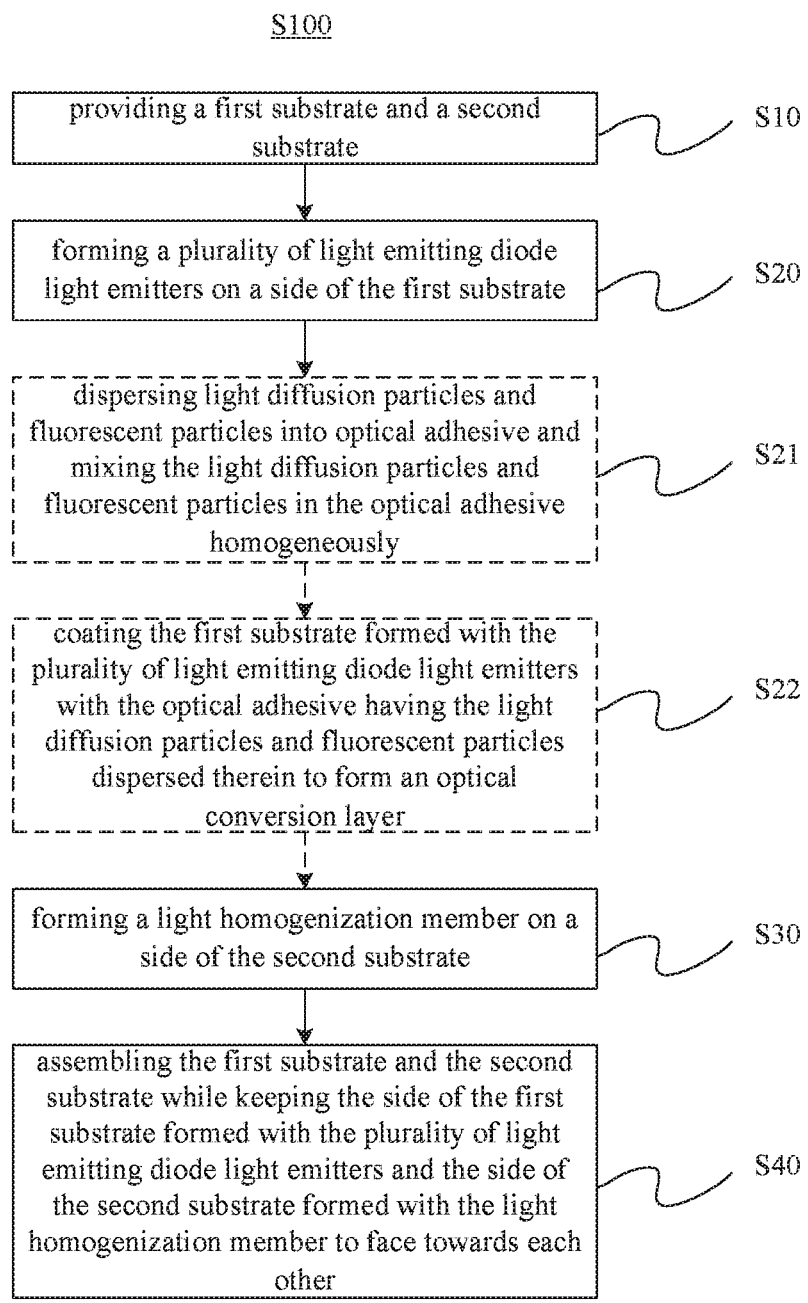
FIG. 9 is a flow chart of a method for manufacturing a light source in accordance with some embodiments of the present disclosure.

As shown in FIG. 9, embodiments of the present disclosure also provide a method S100 for manufacturing a light source. The method includes:

Step S10: providing a first substrate and a second substrate;

Step S20: forming a plurality of light emitting diode light emitters on a side of the first substrate;

Step S30: forming a light homogenization member on a side of the second substrate; and Step S40: assembling the first substrate and the second substrate while keeping the side of the first substrate formed with the plurality of light emitting diode light emitters and the side of the second substrate formed with the light homogenization member to face towards each other.

In some embodiments, after the above Step S20, the method further includes:

Step S21: dispersing light diffusion particles and fluorescent particles into optical adhesive and mixing the light diffusion particles and fluorescent particles in the optical adhesive homogeneously; and Step S22: coating the first substrate formed with the plurality of light emitting diode light emitters with the optical adhesive having the light diffusion particles and fluorescent particles dispersed therein to form an optical conversion layer.

It should be noted that the method for manufacturing the light source shown in FIG. 5 to FIG. 6 is similar to the method for manufacturing the light source shown in FIG. 2 to FIG. 3. It may refer to the above description of the manufacturing method. The details will be omitted herein.

For example, the seal agent may include rubber and double side adhesive tape, may alternatively include other materials having adhering effect and the effect of blocking water and oxygen gas.

Figure 7:
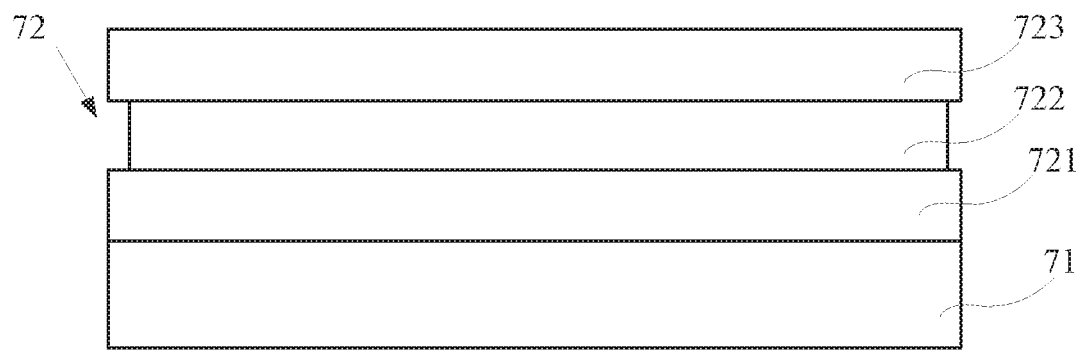
FIG. 7 is a schematic view showing a structure of a display apparatus in accordance with some embodiments of the present disclosure.

For example, the light source according to the embodiments of the present disclosure may be used in a display apparatus. With reference to FIG. 7, it shows a display apparatus including a backlight module 71 and a display panel 72. The backlight module 71 may include the light source according to the embodiments of the present disclosure, i.e., the light source discussed as above. The display panel 72 may include an array substrate 721, a color filter substrate 723 arranged opposite to the array substrate 721, and a liquid crystal layer 722 arranged between the array substrate 721 and the color filter substrate 723. With the light source according to the embodiments of the present disclosure used as the backlight module, not only homogeneous backlight can be provided for the display apparatus, but also the lightening and thinning of the display apparatus can be achieved.

Figure 8:
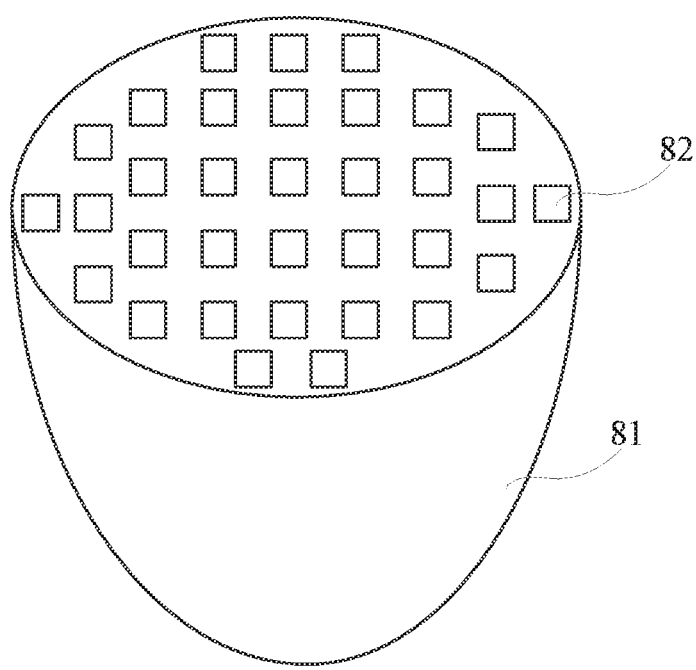
FIG. 8 is a schematic view showing a structure of an illumination apparatus in accordance with some embodiments of the present disclosure.

For example, the light source according to the embodiments of the present disclosure may be used in an illumination apparatus. With reference to FIG. 8, it shows an illumination apparatus including a body 81 and one or more illumination light sources 82 mounted on the body 81 of the apparatus. At least one of the one or more illumination light sources 82 may be the light source according to the embodiments of the present disclosure, i.e., the light source discussed as above. With the light source according to the embodiments of the present disclosure used as the illumination light source, not only homogeneous illumination light can be provided by the illumination apparatus, but also the lightening and thinning of the illumination apparatus can be achieved.

Some embodiments of the generic concept of the present disclosure have been illustrated and explained, however, those skilled in the art should appreciate that modifications and variations may be made to these embodiments of the present disclosure without departing from the principle and spirit of the present disclosure. The scope of the present disclosure is defined by the appended claims and their equivalents.

What is claimed is:

1. A light source, comprising:
 a first substrate;
 a second substrate opposite to the first substrate;
 a plurality of light emitting diode light emitters arranged on a side of the first substrate facing towards the second substrate;
 a light homogenization member arranged on a side of the second substrate facing towards the first substrate; and
 an optical conversion layer arranged between the first substrate and the light homogenization member, the optical conversion layer comprising optical adhesive and fluorescent particles dispersed in the optical adhesive,
 wherein the light homogenization member is arranged on a light exit side of the plurality of light emitting diode light emitters and configured such that light emitted from the plurality of light emitting diode light emitters exits homogenously from the second substrate; and
 wherein the light homogenization member comprises a partially transmissive and partially reflective layer configured to transmit a first part of light incident onto the partially transmissive and partially reflective layer and reflect a second part of the light incident onto the partially transmissive and partially reflective layer.

2. The light source of claim 1, wherein the optical conversion layer further comprises light diffusion particles dispersed in the optical adhesive.

3. The light source of claim 1, further comprising seal agent arranged between the first substrate and the second substrate and surrounding the plurality of light emitting diode light emitters, the optical conversion layer and the light homogenization member.

4. The light source of claim 1, wherein the partially transmissive and partially reflective layer comprises a plurality of partially transmissive and partially reflective portions arranged in an array and spaced from each other, the plurality of partially transmissive and partially reflective portions being in one-to-one correspondence with the plurality of light emitting diode light emitters, and an orthographic projection of each of the plurality of partially transmissive and partially reflective portions onto the first substrate covers an orthographic projection of a corresponding one of the plurality of light emitting diode light emitters onto the first substrate.

5. The light source of claim 1, further comprising a reflective layer arranged between the first substrate and the light homogenization member and configured to reflect light incident onto the reflective layer towards the light exit side of the plurality of light emitting diode light emitters.

6. The light source of claim 5, further comprising a wiring layer arranged between the plurality of light emitting diode light emitters and the first substrate,
 wherein the wiring layer comprises a plurality of contact pads for electrically contacting with the plurality of light emitting diode light emitters.

7. The light source of claim 6, wherein each of the plurality of light emitting diode light emitters comprises a first electrode and a second electrode; and the plurality of contact pads comprise a first contact pad electrically connected to the first electrode and a second contact pad electrically connected to the second electrode.

8. The light source of claim 6, further comprising:
 a second insulating layer arranged between the wiring layer and the reflective layer; and/or
 a protection layer arranged on a side of the reflective layer away from the first substrate.

9. The light source of claim 5, further comprising:
 a first wiring layer arranged between the plurality of light emitting diode light emitters and the first substrate;
 a second wiring layer arranged on a side of the first wiring layer away from the first substrate; and
 a first insulating layer arranged between the first wiring layer and the second wiring layer,
 wherein the second wiring layer comprises a plurality of contact pads for electrically contacting with the plurality of light emitting diode light emitters respectively;
 wherein an electrical connecting portion is formed in the first insulating layer; and the first wiring layer is electrically connected to the contact pads by the electrical connecting portion.

10. The light source of claim 9, further comprising:
a second insulating layer arranged between the second wiring layer and the reflective layer; and/or
a protection layer arranged on a side of the reflective layer away from the first substrate.

11. The light source of claim 1, wherein the plurality of light emitting diode light emitters are light emitting diode chips.

12. The light source of claim 1, wherein the first substrate and the second substrate are both glass substrates.

13. The light source of claim 1, wherein an area of a surface of the second substrate facing towards the first substrate is less than an area of a surface of the first substrate facing towards the second substrate.

14. A display apparatus comprising a backlight module, wherein the backlight module comprises the light source of claim 1.

15. The display apparatus of claim 14, wherein the light source further comprises an optical conversion layer arranged between the first substrate and the light homogenization member, the optical conversion layer comprising optical adhesive and fluorescent particles dispersed in the optical adhesive.

16. An illumination apparatus comprising one or more light sources of claim 1.

17. A method for manufacturing a light source, the method comprising:
providing a first substrate and a second substrate;
forming a plurality of light emitting diode light emitters on a side of the first substrate;
forming a light homogenization member on a side of the second substrate; and
assembling the first substrate and the second substrate while keeping the side of the first substrate formed with the plurality of light emitting diode light emitters and the side of the second substrate formed with the light homogenization member facing towards each other;
wherein after forming the plurality of light emitting diode light emitters on the side of the first substrate, the method further comprises:
dispersing light diffusion particles and fluorescent particles into optical adhesive and mixing the light diffusion particles and fluorescent particles in the optical adhesive homogeneously; and
coating the first substrate formed with the plurality of light emitting diode light emitters with the optical adhesive having the light diffusion particles and fluorescent particles dispersed therein to form an optical conversion layer; and
wherein the light homogenization member is formed with a partially transmissive and partially reflective layer configured to transmit a first part of light incident onto the partially transmissive and partially reflective layer and reflect a second part of the light incident onto the partially transmissive and partially reflective layer.

* * * * *